(12) United States Patent
Dreps et al.

(10) Patent No.: US 7,859,318 B2
(45) Date of Patent: Dec. 28, 2010

(54) DELAY LINE REGULATION USING HIGH-FREQUENCY MICRO-REGULATORS

(75) Inventors: Daniel Dreps, Georgetown, TX (US); Daniel Friedman, Sleepy Hollow, NY (US); Seongwon Kim, Old Tappan, NJ (US); Hector Saenz, Round Rock, TX (US); Glen Wiedemeier, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/030,946

(22) Filed: Feb. 14, 2008

(65) Prior Publication Data
US 2009/0206952 A1 Aug. 20, 2009

(51) Int. Cl.
*H03H 11/26* (2006.01)
(52) U.S. Cl. .................. 327/261; 327/262; 327/284
(58) Field of Classification Search .............. 327/261, 327/262, 284, 285, 288, 290, 310, 551
See application file for complete search history.

(56) References Cited

U.S. PATENT DOCUMENTS

| 4,527,202 | A | * | 7/1985 | Ohta | ........................ | 360/18 |
|---|---|---|---|---|---|---|
| 6,157,180 | A | | 12/2000 | Kuo | | |
| 6,229,364 | B1 | | 5/2001 | Dortu et al. | | |
| 6,351,191 | B1 | | 2/2002 | Nair et al. | | |
| 6,392,456 | B1 | * | 5/2002 | Pyeon et al. | ................. | 327/156 |
| 6,476,656 | B2 | | 11/2002 | Dally et al. | | |
| 6,687,881 | B2 | | 2/2004 | Gauthier et al. | | |
| 6,744,307 | B2 | * | 6/2004 | Ikeda et al. | ................. | 327/559 |
| 7,061,292 | B2 | | 6/2006 | Maksimovic et al. | | |
| 7,639,067 | B1 | * | 12/2009 | Perisetty | .................... | 327/537 |
| 2007/0257696 | A1 | * | 11/2007 | Eldridge et al. | ............. | 324/765 |
| 2008/0231352 | A1 | * | 9/2008 | Kurd et al. | ................... | 327/544 |

* cited by examiner

*Primary Examiner*—Long Nguyen
(74) *Attorney, Agent, or Firm*—Tutunjian & Bitetto, P.C.; Anne V. Dougherty, Esq.

(57) ABSTRACT

A regulated delay line device includes main regulator coupled to a node, and a plurality of delay branches coupled to the node to receive a voltage output to the node by the main regulator. Each of the plurality of delay branches includes a micro-regulator and a delay line. The delay line is coupled to the micro-regulator such that unfiltered noise is removed locally at each delay branch by a corresponding micro-regulator.

20 Claims, 3 Drawing Sheets

DELAY LINE REGULATION USING HIGH-FREQUENCY MICRO-REGULATORS

BACKGROUND

1. Technical Field

The present invention relates to linear regulators for integrated circuits, and more particularly to apparatuses and methods for providing regulated power to precision delay lines or elements.

2. Description of the Related Art

Linear regulators are employed in integrated circuits for regulating power voltage for delay lines or delay elements, which may be employed to protect from delay variations. Linear regulators are becoming more popular due, in part, to increased use of System-On-a-Chip (SOC) type semiconductor circuits. SOC devices generate many different kinds of voltage noise due to various macros or cores included in the SOC device. Since these systems typically have very delicate analog macros in the chip, very clean power is needed.

Linear regulator based delay lines suffer from bandwidth limitations because the linear regulators have to drive a large pass-gate transistor which provides a large amount of current needed for the delay line. Thus, to extend the bandwidth to higher frequencies, large amounts of decoupling capacitors are needed.

Referring to FIG. 1, a block diagram of a conventional linear regulator based delay line is shown. A linear regulator 10 includes a feedback loop 12, which includes an error amplifier 14, a pass device 16, a load 18 and a voltage reference 20. This regulator 10 provides high current to delay lines 22, but suffers from bandwidth limitations due to the fact the feedback loop 12 which consists of the error amplifier 14, the pass device 16, the load 18 and the voltage reference 20 have low bandwidth. The low bandwidth is due to the error amplifier 14 having to drive the large pass device (PFET) 16 which provides the current to a core or other device employing the regulated power. The low bandwidth results in higher frequency power supply fluctuation or noise being transferred to the cores or macros resulting in errors or higher power consumption.

Presently, many systems use very large decoupling capacitors 24 to regulate high frequency noise, but this has major disadvantages due to the fact that the capacitor 24 is very expensive to put on a chip due to its consumption of a large area. Decoupling capacitors can occupy areas of 40 microns by 40 microns or larger.

Thus, a need exists for improving the regulation of high-frequency noise and/or providing a higher bandwidth linear regulator.

SUMMARY

A regulated delay line device includes main regulator coupled to a node, and a plurality of delay branches coupled to the node to receive a voltage output to the node by the main regulator. Each of the plurality of delay branches includes a micro-regulator and a delay line. The delay line is coupled to the micro-regulator such that unfiltered noise is removed locally at each delay branch by a corresponding micro-regulator.

A method for filtering noise with a regulated delay line device includes regulating a supply voltage to filter low frequency noise to a node; and providing a plurality of delay branches coupled to the node to receive the supply voltage output to the node. Each of the plurality of delay branches further comprises a micro-regulator; and a delay line coupled to the micro-regulator; and filtering higher frequency noise locally at each delay branch by employing a corresponding micro-regulator.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
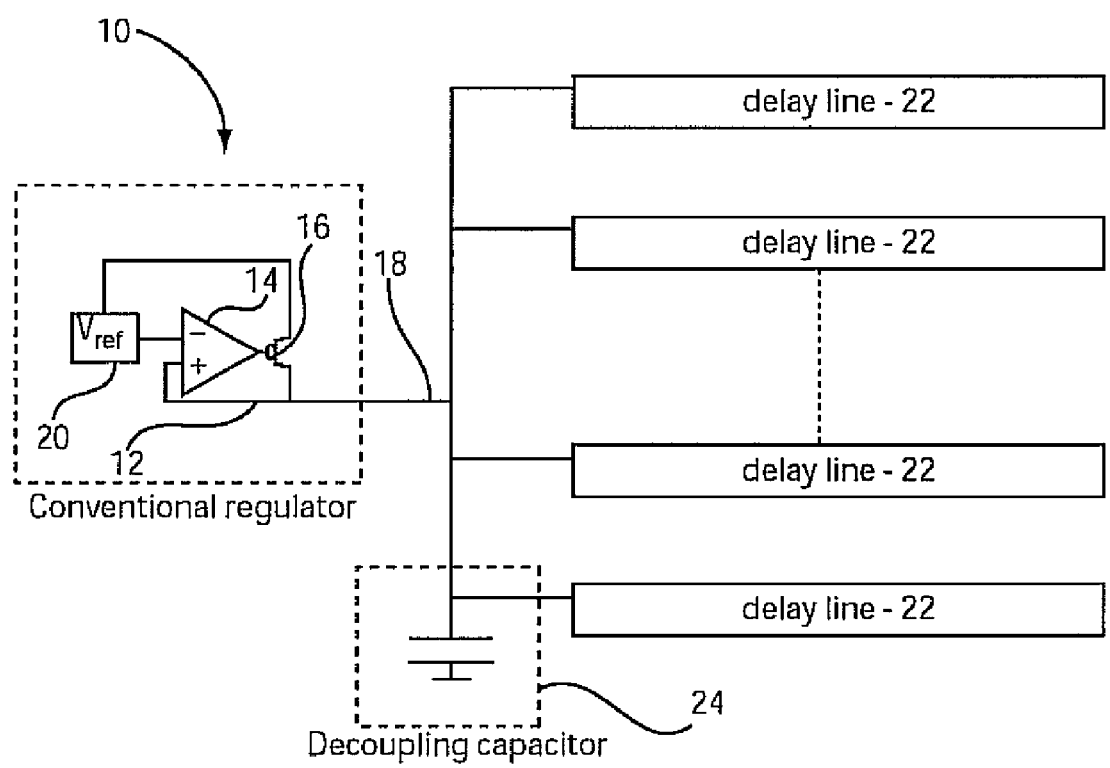
FIG. 1 is a block/schematic diagram showing a conventional circuit with regulated delay lines.

The present principles improve the regulation of high-frequency noise and provide a higher bandwidth linear regulator. Present embodiments preferably include a micro-regulator (μ-regulator) at each delay line. The micro-regulators overcome the low bandwidth problem and avoid the use of a large decoupling capacitor. Instead, the present embodiments provide high frequency micro-regulator structures in addition to the conventional low frequency loop. The micro-regulators are placed close to each delay line to regulate high-frequency noise which has not been filtered out by the main regulator. This forms a cluster of micro-regulators and one conventional linear regulator, which, overall, occupies significantly less area than using a conventional decoupling capacitor to cover the high-frequency noise.

Embodiments of the present invention can take the form of an entirely hardware embodiment, an entirely software embodiment or an embodiment including both hardware and software elements. In a preferred embodiment, the present invention is implemented in hardware in a hard-wired circuit or an integrated circuit. However, the circuit design may be modeled, designed and tested in software.

The circuits as described herein are preferably part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed. The methods as described herein may be used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
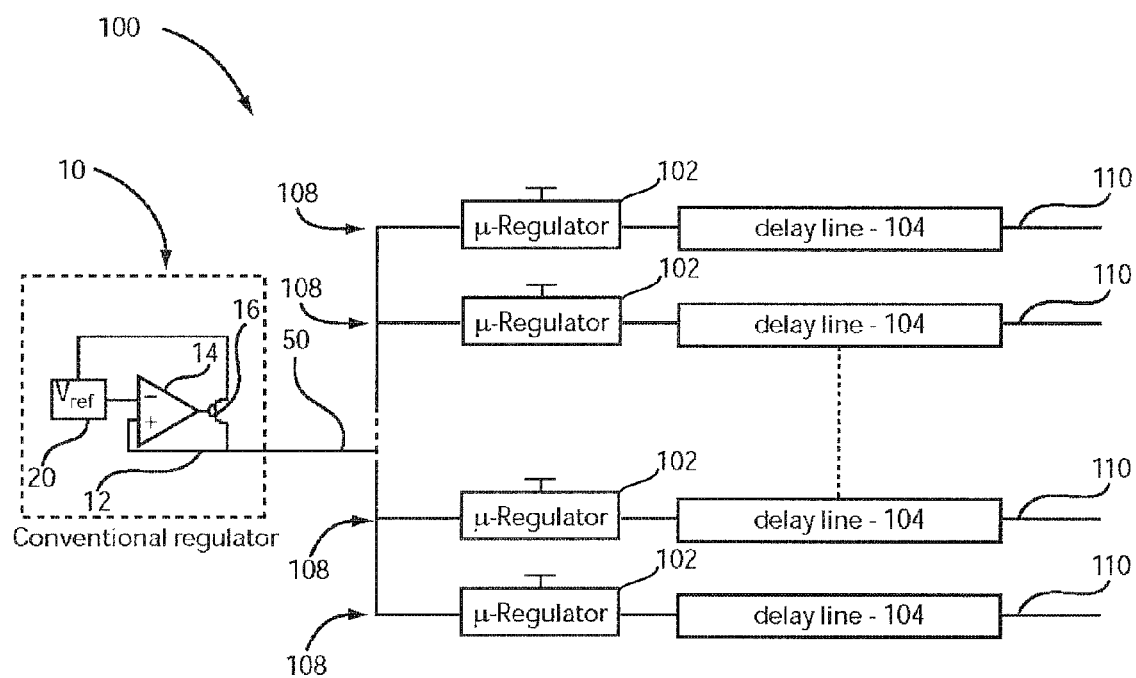
FIG. 2 is a block/schematic diagram showing a regulated delay line device with micro-regulators near delay lines in accordance with one embodiment.

Referring now to the drawings in which like numerals represent the same or similar elements and initially to FIG. 2, a delay line regulation circuit 100 is shown employing high-frequency micro-regulators in accordance with one illustrative embodiment. To overcome the stated low bandwidth problem and to avoid usage of large decoupling capacitors, the illustrative embodiment includes high frequency micro-regulator structures 102 in addition to a low frequency loop 12 provided by, e.g., a conventional regulator 10. The micro-regulators 102 are placed close to each delay line 104 for regulating high-frequency noise which was not filtered out by the conventional regulator 10. In one embodiment, the micro-regulators 102 are placed between about 10 microns and 20 microns from its respective delay line 104, more preferably less than 10 microns away. However, in other embodiments, the micro-regulator 102 may be placed greater than 20 microns away from its respective delay line 104.

The regulated delay line device 100 includes main regulator 10, which is preferably a linear regulator, although other regulators may be employed. Regulator 10 is coupled to a node 50, and a plurality of delay branches 108 are coupled to the node 50 to receive a voltage output to the node by the main regulator 10. Each of the plurality of delay branches includes a micro-regulator 102 and a delay line 104. The delay line 104 is coupled to the micro-regulator 102 such that unfiltered noise is removed locally at each delay branch 108 by a corresponding micro-regulator 102.

In one embodiment, the main regulator 10 filters out low frequency noise for lower frequencies (in the lower half of a noise spectrum) while the micro-regulators filter out noise in the upper of higher frequency range (e.g., upper half of the noise frequency spectrum). By providing the filtering locally in multiple stages, higher bandwidth is made available for the circuit/device 100 to operate.

The micro-regulators 102 are preferably placed adjacent to and near the delay line 104 that they are associated with (preferably about 10 microns away). The micro-regulators 102 may be tailored to that specific delay line's requirements and may be designed to filter different frequency ranges or to provide or condition the voltage to each delay line 104.

A cluster of micro-regulators 102 and one conventional linear regulator 10 may be efficiently laid out in a simple layout of a semiconductor chip. The layout includes a plurality of transistors (FIG. 3) and is able to be arranged in a manner that takes up less space than the layout that employs decoupling capacitors as depicted in FIG. 1. Therefore, area overhead is reduced and the micro-regulators 102 collectively occupy less area than a decoupling capacitor of the prior art and still filter the high-frequency noise. In one example, the layout provides a reduction in layout area of 50% or more as compared with the conventional decoupling capacitor 24 described with respect to FIG. 1. Further, area reductions are also contemplated. Smaller transistors in the micro-regulators 102 at each branch 108 provide an overall area reduction and still provide sufficient filtering effects to filter power noise. In one embodiment, the layout area of the micro-regulator 102 is about 10 microns by 20 about microns or less.

Delay line 104 may be coupled to various circuits through outputs 110. In particularly useful embodiments, delay lines 104 are employed to adjust clock signals. Outputs 110 may be coupled to logic circuits, such as memory logic circuits or any other circuit. Circuit 100 may be employed in receiver chips, memory chips or any other circuit.

Figure 3:
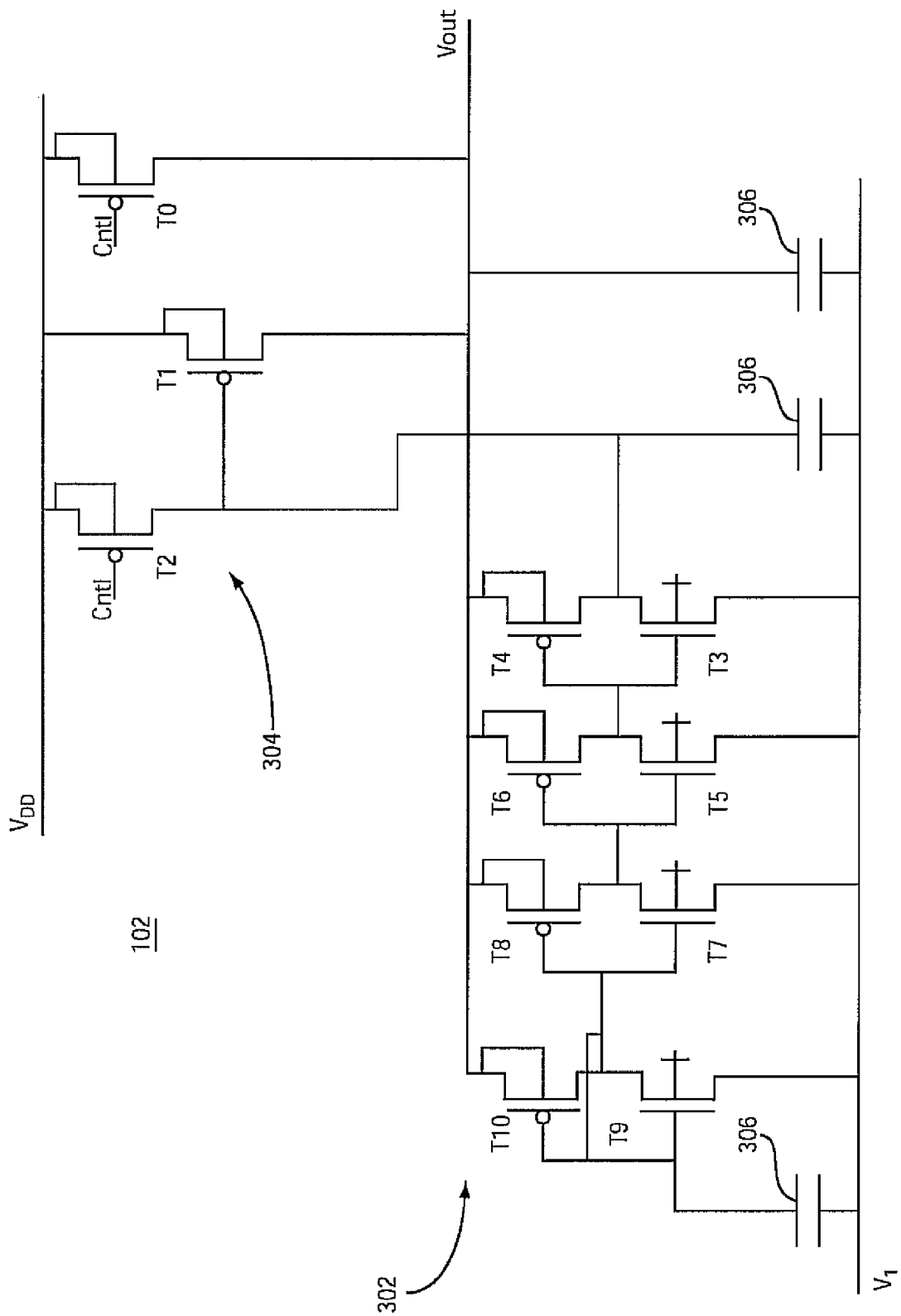
FIG. 3 is a schematic diagram showing an illustrative micro-regulator in accordance with one illustrative embodiment.

Referring to FIG. 3, an illustrative circuit layout is shown for a micro-regulator 102 in accordance with one illustrative embodiment. A control portion 304 is employed as a bypass circuit for a regulator portion 302. Micro-regulator 102 is powered by a supply voltage $V_{DD}$ and employs a control signal (cntl) to activate/deactivate PFETs T0, T1 and T2 for the control of the regulator portion 302. For example, if control signal is set to permit transistors T0 and T1 to conduct then the regulator portion 302 of the circuit is bypassed and $V_{out}$ is $V_{DD}$. Otherwise, the regulator portion is "on" and controls $V_{out}$ in accordance with $V_1$, transistors T3-T10 and capacitors 306 of portion 302.

$V_{out}$ is provided in accordance with capacitors 306 and transistors T3-T10 of portion 302. Capacitors 306 and CMOS transistors T10, T9, T8, T7, T6, T5, T4 and T3 produce $V_{out}$ based upon the current conditions and filter the input voltage $V_1$. For example, $V_1$ is received from the regulator 10 (FIG. 2). If the regulator portion 302 is activated by the control portion 304, voltage $V_1$ is filtered and conditioned in accordance with portion 302 to produce a regulated output $V_{out}$. Different $V_{out}$ voltage magnitudes may also be provided under different conditions, if desired.

The micro-regulator 102 is scalable for different applications. While FIG. 3 shows four sets of CMOS transistors, more or fewer transistors may be employed to permit faster or slower response time. The response time is proportional to a length of the transistor chain, and bandwidth and noise issues can be addressed by scaling the chain length accordingly. For example, high frequency noise would need a faster response time than low frequency noise.

Having described preferred embodiments of a system and method for delay line regulation using high-frequency micro-regulators (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A regulated delay line device, comprising:
   a main regulator coupled to a node; and
   a plurality of delay branches coupled to the node to receive a voltage output to the node by the main regulator;
   each of the plurality of delay branches further comprising:
      a micro-regulator that regulates power voltage; and
      a delay line coupled to the micro-regulator such that unfiltered noise is removed locally at each delay branch by a corresponding micro-regulator.

2. The device as recited in claim 1, wherein the micro-regulator includes a plurality of transistors configured to filter noise to provide a locally filtered output voltage.

3. The device as recited in claim 1, wherein the main regulator is a linear regulator.

4. The device as recited in claim 1, wherein the main regulator is configured to filter lower frequency noise and the micro-regulators are configured to filter higher frequency noise.

5. The device as recited in claim 1, wherein the micro-regulator is interposed between the node and the delay line in each delay branch.

6. The device as recited in claim 1, wherein the micro-regulator is directly adjacent to its corresponding delay line in each delay branch.

7. The device as recited in claim 1, wherein the micro-regulator is within 20 microns of the delay line in each delay branch.

8. The device as recited in claim 1, wherein the micro-regulators in the device collectively occupy less area on a chip than a conventional decoupling capacitor.

9. The device as recited in claim 1, wherein the micro-regulators in the device collectively occupy less than 50% of the conventional decoupling capacitor area.

10. A regulated delay line device, comprising:
    a main regulator coupled to a node, the main regulator including a feedback loop having a pass gate device and an amplifier coupled to the node; and
    a plurality of delay branches coupled to the node to receive a voltage output to the node by the main regulator;
    each of the plurality of delay branches further comprising:
        a micro-regulator that regulates power voltage including a plurality of transistors configured to filter noise to provide a locally filtered output voltage such that unfiltered noise is removed locally at each delay branch; and
        a delay line coupled to the micro-regulator which receives the locally filtered output voltage.

11. The device as recited in claim 10, wherein the main regulator is configured to filter lower frequency noise and the micro-regulators are configured to filter higher frequency noise.

12. The device as recited in claim 10, wherein the micro-regulator is interposed between the node and the delay line in each delay branch.

13. The device as recited in claim 10, wherein the micro-regulator is within 20 microns of the delay line in each delay branch.

14. The device as recited in claim 10, wherein the micro-regulators in the device collectively occupy less area on a chip than a conventional decoupling capacitor.

15. The device as recited in claim 10, wherein the micro-regulators in the device collectively occupy less than 50% of the conventional decoupling capacitor area.

16. A method for filtering noise with a regulated delay line device, comprising:
    regulating a supply voltage to filter low frequency noise to a node;
    providing a plurality of delay branches coupled to the node to receive the supply voltage output to the node, each of the plurality of delay branches further comprising: a micro-regulator that regulates power voltage; and a delay line coupled to the micro-regulator; and
    filtering higher frequency noise locally at each delay branch by employing a corresponding micro-regulator.

17. The method as recited in claim 16, wherein the micro-regulator includes a plurality of transistors, and the method further comprising enabling the transistors to remove the higher frequency noise from an output voltage.

18. The method as recited in claim 16, wherein the micro-regulator is interposed between the node and the delay line in each delay branch.

19. The method as recited in claim 16, wherein the micro-regulator is directly adjacent to its corresponding delay line in each delay branch.

20. The method as recited in claim 16, wherein the micro-regulators in the device collectively occupy less area on a chip than a conventional decoupling capacitor.

* * * * *